(12) United States Patent
Luo et al.

(10) Patent No.: US 11,572,616 B2
(45) Date of Patent: Feb. 7, 2023

(54) MASK STRIP, MASK PLATE FRAME, MASK PLATE AND WELDING METHOD THEREOF

(71) Applicants: Chengdu BOE Optoelectronics Technology Co., Ltd., Sichuan (CN); BOE Technology Group Co., Ltd., Beijing (CN)

(72) Inventors: Chang Luo, Beijing (CN); Fengli Ji, Beijing (CN); Jianpeng Wu, Beijing (CN); Xiaoyu Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/912,872

(22) Filed: Jun. 26, 2020

(65) Prior Publication Data
US 2020/0407836 A1     Dec. 31, 2020

(30) Foreign Application Priority Data

Jun. 27, 2019 (CN) .......................... 201910569996.0

(51) Int. Cl.
| | | |
|---|---|---|
| *C23C 14/04* | (2006.01) | |
| *B05C 21/00* | (2006.01) | |
| *H01L 51/56* | (2006.01) | |
| *H01L 51/00* | (2006.01) | |

(52) U.S. Cl.
CPC .......... *C23C 14/042* (2013.01); *B05C 21/005* (2013.01); *H01L 51/56* (2013.01); *H01L 51/0011* (2013.01)

(58) Field of Classification Search
None
See application file for complete search history.

(56) References Cited

U.S. PATENT DOCUMENTS

| | | | |
|---|---|---|---|
| 2010/0267227 A1 | 10/2010 | Ko et al. | |
| 2012/0234235 A1* | 9/2012 | Lee ........................ | C23C 16/042 118/504 |
| 2014/0033975 A1* | 2/2014 | Oh ..................... | H01L 21/02104 118/504 |
| 2021/0172047 A1* | 6/2021 | Yang ........................ | G03F 1/38 |

FOREIGN PATENT DOCUMENTS

| | | |
|---|---|---|
| CN | 207775334 U | 8/2018 |
| CN | 108796435 A | 11/2018 |
| CN | 208604193 U | 3/2019 |
| EP | 3633063 A1 | 4/2020 |
| WO | WO20180218935 A1 | 12/2018 |

OTHER PUBLICATIONS

First office action of Chinese application No. 201910569996.0 dated Oct. 13, 2020.

\* cited by examiner

*Primary Examiner* — Jethro M. Pence
(74) *Attorney, Agent, or Firm* — Fay Sharpe LLP (57) ABSTRACT

Disclosed are a mask strip, a mask plate frame, a mask plate, and a welding method thereof. The mask strip includes a first welding region, a second welding region, and a pattern region between the first welding region and the second welding region. In addition, a bendable region is disposed both between the first welding region and the pattern region and between the second welding region and the pattern region.

15 Claims, 9 Drawing Sheets

MASK STRIP, MASK PLATE FRAME, MASK PLATE AND WELDING METHOD THEREOF

CROSS-REFERENCE TO RELATED APPLICATIONS

This application claims priority to Chinese Patent Application No. 201910569996.0, filed on Jun. 27, 2019 and entitled "METAL MASK STRIP, MASK PLATE FRAME, METAL MASK PLATE AND WELDING METHOD THEREOF", the entire contents of which are incorporated herein by reference.

TECHNICAL FIELD

The present disclosure relates to the field of display technologies, and in particular, relates to a mask strip, a mask plate frame, a mask plate, and a welding method thereof.

BACKGROUND

Metal mask plates are currently widely used in the manufacture of organic light-emitting diode (OLED) display panels.

The metal mask plate includes a mask plate frame and a metal mask strip. During use, the metal mask strip is fixed to the mask plate frame by steps such as net tensioning and welding. For example, two ends of the metal mask strip are clamped with a mechanical gripper, and then the metal mask strip is stretched to align a welding region of the metal mask strip with a welding region on the surface of the mask plate frame. The metal mask strip is welded to the mask plate frame by laser welding.

SUMMARY

Embodiments of the present disclosure provide a mask strip, a mask plate frame, a mask plate, and a welding method thereof. The technical solutions are as follows.

In one aspect, a mask strip is provided. The mask strip includes a first welding region, a second welding region, and a pattern region between the first welding region and the second welding region; and the mask strip further includes a bendable region, the bendable region being disposed both between the first welding region and the pattern region, and between the second welding region and the pattern region.

Optionally, at least one of a region between the first welding region and the pattern region and a region between the second welding region and the pattern region is provided with two bendable regions.

Optionally, the two bendable regions are sequentially disposed along a lengthwise direction of the mask strip.

Optionally, the mask strip further includes a third welding region disposed:
between the bendable region and the first welding region; and/or
between the bendable region and the second welding region.

Optionally, the bendable region has a visible feature that distinguishes the bendable region from a region of the mask strip except the bendable region.

Optionally, the visible feature includes: a thickness of the bendable region being greater than that of the region of the mask strip except the bendable region.

Optionally, the visible feature includes: the bendable region being patterned.

Optionally, the mask strip is a metal mask strip.

Optionally, at least one of a region between the first welding region and the pattern region and a region between the second welding region and the pattern region is provided with two bendable regions, and the two bendable regions are sequentially disposed along a lengthwise direction of the mask strip; and the mask strip further includes a third welding region disposed:
between the bendable region and the first welding region; and/or
between the bendable region and the second welding region.

In another aspect, a mask plate frame is provided. The mask plate frame includes a top surface and a bottom surface which are opposite to each other, a side surface connected to the top surface and the bottom surface, and a hollow structure running through the top surface and the bottom surface;

wherein the side surface of the mask plate frame includes two welding regions which are disposed on two opposite sides of the hollow structure respectively.

Optionally, the side surface includes a first inclined surface, a first included angle defined between the first inclined surface and the bottom surface being an acute angle;

wherein at least one of the two welding regions is disposed on the first inclined surface.

Optionally, the first included angle is in a range of 5 to 45 degrees.

Optionally, the side surface further includes a second inclined surface disposed between the top surface and the first inclined surface, the first inclined surface being connected to the second inclined surface, the second inclined surface being connected to the top surface, a first connecting line and a second connecting line being arranged parallel to each other, the first connecting line being a connecting line that connects the first inclined surface and the second inclined surface, and the second connecting line being a connecting line that connects the second inclined surface and the top surface.

Optionally, the first included angle defined between the first inclined surface and the bottom surface is smaller than a second included angle defined between the second inclined surface and the bottom surface.

Optionally, a difference between the first included angle and the second included angle is in a range of 5 to 35 degrees.

Optionally, the second inclined surface is provided with a groove.

Optionally, the mask plate frame further includes an arcuate bending region;

wherein the arcuate bending region is disposed at:
an intersection of the first inclined surface and the second inclined surface; and/or
an intersection of the second inclined surface and the top surface.

Optionally, the arcuate bending region has an arc radius greater than a thickness of the mask strip.

Optionally, the side surface includes a first inclined surface, a first included angle defined between the first inclined surface and the bottom surface being an acute angle;

wherein at least one of the two welding regions is disposed on the first inclined surface, and the first included angle is in a range of 5 to 45 degrees; and the side surface further includes a second inclined surface disposed between the top surface and the first inclined surface, the first inclined surface being connected to the second inclined surface, the second inclined surface being connected to the top surface, a first connecting line and a second connecting line being arranged parallel to each other, the first connecting line being a connecting line that connects the first inclined surface and the second inclined surface, and the second connecting line being a connecting line that connects the second inclined surface and the top surface.

In still another aspect, a mask plate is provided. The mask plate includes a mask strip and a mask plate frame; wherein the mask strip includes a first welding region, a second welding region, and a pattern region between the first welding region and the second welding region;

the mask strip further includes a bendable region, the bendable region being disposed both between the first welding region and the pattern region, and between the second welding region and the pattern region;

the mask plate frame includes a top surface and a bottom surface which are opposite to each other, a side surface connected to the top surface and the bottom surface, and a hollow structure running through the top surface and the bottom surface; and the side surface of the mask plate frame includes two welding regions which are disposed on two opposite sides of the hollow structure respectively.

In yet still another aspect, a welding method of a mask plate is provided. The method includes:

stretching the mask strip as described above;

bonding the mask strip to the top surface of the mask plate frame as described above, and covering an outer edge of the top surface of the mask plate frame with the bendable region of the mask strip;

bending the bendable region of the mask strip, such that the first welding region of the mask strip overlaps one welding region of the mask plate frame and the second welding region of the mask strip overlaps the other welding region of the mask plate frame; and welding the mask strip to the mask plate frame in the first welding region and the second welding region of the mask strip.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

For clearer descriptions of the objectives, technical solutions and advantages in the present disclosure, the present disclosure is described in detail below in combination with the accompanying drawings.

In the manufacturing process of an OLED display panel, the surface of a substrate may be shielded with a metal mask plate and then a coating material is treated by a sputtering process or an evaporation process, such that the coating material passes through a hollow portion of the metal mask plate and is deposited on the surface of the substrate. Thus, a patterned film layer is formed.

As a metal mask strip has a smaller thickness and is provided with a pattern region (i.e., the hollow portion on the above metal mask plate), an uneven internal stress may be generated in the metal mask strip in the process of stretching the metal mask strip and thus the metal mask strip may wrinkle due to a buckling effect of the thin film structure. As a result, the pattern region is deformed and coating accuracy is affected. In addition, welding spots formed by laser welding have a specific height, resulting in a gap between a mask plate frame and the metal mask strip, and different heights of the welding spots at different positions may cause the metal mask strip to fluctuate with the welding spots to form wrinkles. This also affects the coating accuracy (such as inaccurate coating position or inappropriate coating size). Moreover, the welding spots also increase the gap between the metal mask plate and the surface of the substrate, which affects the alignment accuracy and then affects the coating accuracy. Furthermore, a relatively larger force on the welding spots when the substrate is in contact with the metal mask plate may cause damages to the substrate.

Figure 1:
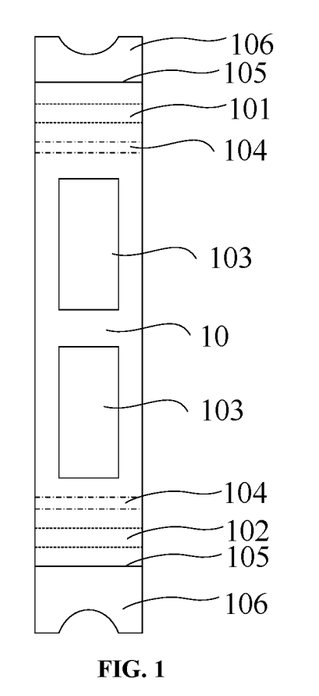
FIG. 1 is a structural diagram of a metal mask strip according to an embodiment of the present disclosure.

FIG. 1 is a structural diagram of a mask strip according to an embodiment of the present disclosure. With reference to FIG. 1, the mask strip 10 includes a first welding region 101, a second welding region 102, and a pattern region 103 between the first welding region 101 and the second welding region 102. The mask strip 10 further includes a bendable region 104. The bendable region 104 is disposed both between the first welding region 101 and the pattern region 103, and between the second welding region 102 and the pattern region 103.

Both the first welding region 101 and the second welding region 102 refer to regions for welding to a mask plate frame. The pattern region 103 includes a plurality of hollow holes. These hollow holes correspond to a pixel region on a display base plate during a vapor deposition process, such that the coating material treated by the sputtering process or the evaporation process passes through the hollow holes and is attached to the substrate for manufacturing the display base plate. The bendable region 104 refers to a region for bending the mask strip 10 to weld the first welding region 101 and the second welding region 102 to a side surface of the mask plate frame.

Optionally, the mask strip 10 may be a metal mask strip.

In this metal mask strip 10, the bendable region 104 is disposed both between the first welding region 101 and the pattern region 103, and between the second welding region 102 and the pattern region 103. When the metal mask strip 10 is used, the metal mask strip 10 needs to be welded to the mask plate frame. During welding, the pattern region 103 corresponds to a hollow structure on the mask plate frame, the bendable region 104 covers an edge, proximal to a side surface of the mask plate frame which is provided with a welding region, of a top surface of the mask plate frame (that is, the bendable region 104 covers an outer edge of the top surface), and then the metal mask strip 10 is bent downwards in the bendable region 104. In this case, the first welding region 101 and the second welding region 102 of the metal mask strip 10 are welded to the side surface of the mask plate frame, such that welding spots are lower than the top surface of the mask plate frame. Therefore, the gap between the metal mask plate and the surface of the substrate is eliminated, alignment accuracy is improved and thus the coating accuracy is improved. In addition, no damage may be caused to the substrate since the substrate is in no contact with the welding spots. Moreover, after the metal mask strip 10 is bent, wrinkles outside the bendable region 104 (such as the welding region) may not be transferred to the pattern region 103, such that the wrinkles in the pattern region 103 of the metal mask strip 10 may be flattened, thereby improving coating accuracy.

In the metal mask strip 10, the bendable region 104 has a visible feature that distinguishes the bendable region from other regions (such as the welding region) of the metal mask strip 10 except the bendable region. For example, the bendable region 104 has a thickness greater than those of the other regions of the metal mask strip 10, such that the bendable region 104 has an improved strength and a low possibility of being damaged; the bendable region 104 may be a region that has been patterned (such as hollowed), such that the bendable region 104 overlaps the edge of the side surface of the mask plate frame during welding and it is easier to bend the bendable region 104 at the same time; or a mark line is disposed in the bendable region 104, such that the bendable region 104 overlaps the edge of the side surface of the mask plate frame during welding.

In the metal mask strip 10 shown in FIG. 1, two welding regions are arranged, i.e., the first welding region 101 and the second welding region 102. A region between each welding region and the pattern region 103 is provided with one bendable region 104. That is, two bendable regions 104 are shown in FIG. 1, which may be spaced apart from each other. In other embodiments, the number of bendable regions 104 and the number of welding regions may be greater than two. The bendable regions 104 may also be spaced apart from one another. The numbers of welding regions on two sides of the pattern region 103 may be unequal or equal; the numbers of the bendable regions 104 on two sides of the pattern region 103 may be unequal or equal; and the number of the welding regions and the number of bendable regions 104 on the metal mask strip 10 may be unequal or equal, which is not limited in the embodiment of the present disclosure.

As shown in FIG. 1, the metal mask strip 10 further includes two cutting lines 105 and two clamping regions 106. The cutting line 105 refers to a cutting line along which the metal mask strip 10 is cut after welding is completed to remove unnecessary parts on the metal mask strip 10. The clamping region 106 refers to a region in which the mask strip 10 is clamped in a welding process.

Figure 2:
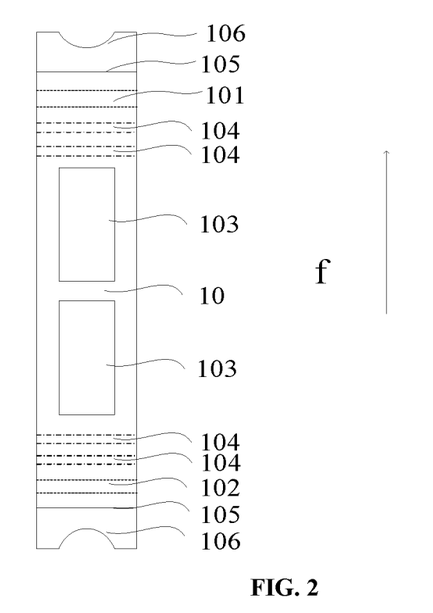
FIG. 2 is a structural diagram of another metal mask strip according to an embodiment of the present disclosure.

Optionally, at least one of a region between the first welding region and the pattern region and a region between the second welding region and the pattern region is provided with two bendable regions. Exemplarily, as shown in FIG. 2 which is a structural diagram of another metal mask strip according to an embodiment of the present disclosure. With reference to FIG. 2, the metal mask strip shown in FIG. 2 differs from the metal mask strip shown in FIG. 1 in that in the structure shown in FIG. 2, two bendable regions 104 are disposed between the first welding region 101 and the pattern region 103, and the two bendable regions 104 are sequentially disposed between the pattern region 103 and the first welding region 101; and two bendable regions 104 are disposed between the second welding region 102 and the pattern region 103, and the two bendable regions 104 are sequentially disposed between the pattern region 103 and the second welding region 102. That is, the two bendable regions are sequentially disposed along a lengthwise direction of the metal mask strip 10.

By disposing the two bendable regions 104 between the first welding region 101 and the pattern region 103 and the two bendable regions 104 between the second welding region 102 and the pattern region 103, the flattening effect on wrinkles of the metal mask strip 10 may be enhanced.

In other implementations, it is also possible to dispose two bendable regions 104 in the region between the first welding region 101 and the pattern region 103 or in the region between the second welding region 102 and the pattern region 103. That is, one bendable region 104 is disposed on one side of the pattern region 103 of the metal mask strip 10, and the two bendable regions are disposed on the other side thereof. As such, the metal mask strip 10 has a simpler structure.

In other implementations, the number of bendable regions 104 between the first welding region 101 and the pattern region 103 may be greater than two; and the number of bendable regions 104 between the second welding region 102 and the pattern region 103 may also be greater than two.

In addition, the number of bendable regions 104 between the first welding region 101 and the pattern region 103 may be equal or unequal to the number of bendable regions 104 between the second welding region 102 and the pattern region 103.

Figure 3:
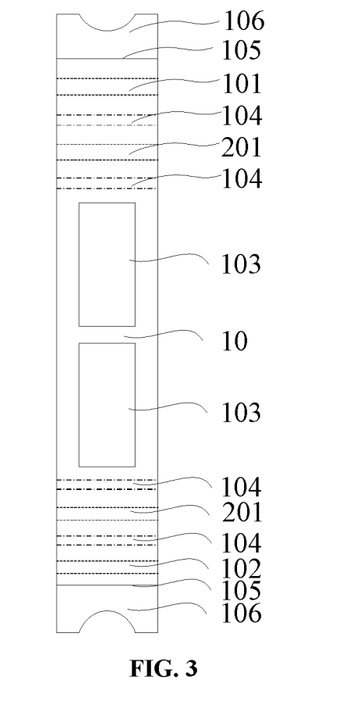
FIG. 3 is a structural diagram of still another metal mask strip according to an embodiment of the present disclosure.

FIG. 3 is a structural diagram of still another metal mask strip according to an embodiment of the present disclosure. The metal mask strip shown in FIG. 3 differs from the metal mask strip shown in FIG. 1 in that in the structure shown in FIG. 3, the metal mask strip 10 further includes a third welding region 201, and one third welding region 201 is disposed between the bendable region 104 and the first welding region 101 and one third welding region 201 is disposed between the bendable region 104 and the second welding region 102.

By disposing two welding regions on each of two sides of the pattern region 103 of the metal mask strip 10, the fixing effect on the metal mask strip 10 can be enhanced.

In other implementations, it is also possible to dispose the third welding region 201 in one of a region between the first welding region 101 and the bendable region 104 and a region between the second welding region 102 and the bendable region 104, such that one bendable region is disposed on one side of the pattern region 103, and two bendable regions are disposed on the other side thereof. As such, a simpler structure is achieved.

In other implementations, the number of third welding regions 201 between the first welding region 101 and the pattern region 103 may be greater than one; and the number of third welding regions 201 between the second welding region 102 and the pattern region 103 may also be greater than one.

In addition, the number of third welding regions 201 between the first welding region 101 and the bendable region 104 may be equal or unequal to the number of third welding regions 201 between the second welding region 102 and the bendable region 104.

In the metal mask strip 10 shown in FIG. 3, one bendable region 104 is disposed between the first welding region 101 and the third welding region 201 and one bendable region 104 is disposed between the second welding region 102 and the third welding region 201. That is, two bendable regions 104 are disposed between the first welding region 101 and the pattern region 103; and two bendable regions 104 are disposed between the second welding region 102 and the pattern region 103.

In other implementations, it is also possible that no bendable region 104 is disposed between the first welding region 101 and the third welding region 201 or between the second welding region 102 and the third welding region 201. Thus, the structure of the metal mask strip 10 is simplified.

In other implementations, it is also possible to dispose a plurality of bendable regions 104 between the first welding region 101 and the third welding region 201 or the second welding region 102 and the third welding region 201, such that the flattening effect on the wrinkles of the metal mask strip 10 is enhanced.

Figure 4:
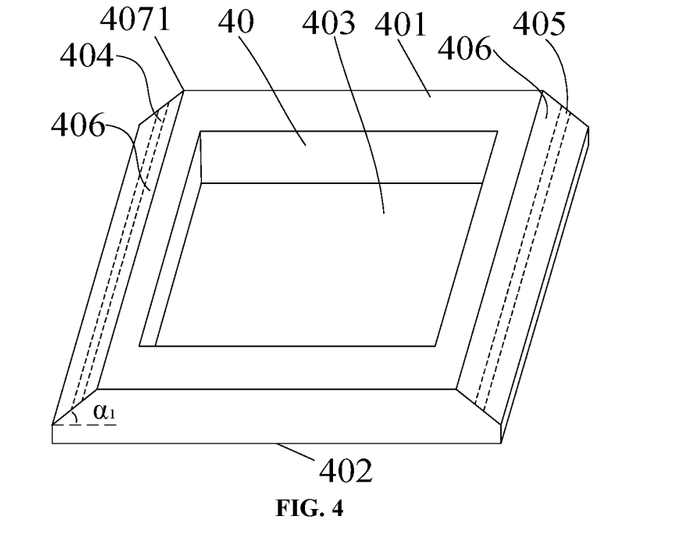
FIG. 4 is a structural diagram of a mask plate frame according to an embodiment of the present disclosure.

FIG. 4 is a structural diagram of a mask plate frame according to an embodiment of the present disclosure. With reference to FIG. 4, the mask plate frame 40 includes a top surface 401 and a bottom surface 402 which are opposite to each other, a side surface connected to the top surface and the bottom surface, and a hollow structure 403 running through the top surface 401 and the bottom surface 402. The side surface of the mask plate frame 40 includes two welding regions (a first welding region 404 and a second welding region 405). The two welding regions are disposed on two opposite sides of the hollow structure 403 respectively, that is, the first welding region 404 and the second welding region 405 are disposed on two opposite sides of the hollow structure 403 respectively. Both the first welding region 404 and the second welding region 405 are disposed between the top surface 401 and the bottom surface 402 of the mask plate frame 40.

The top surface 401 of the mask plate frame 40 refers to a surface, in contact with the substrate, of the mask plate frame 40, and the bottom surface 402 thereof refers to a surface opposite to the top surface 401 of the mask plate frame 40. The hollow structure 403 corresponds to the pattern region 103 shown in FIG. 1. In the vapor deposition process, the coating material treated by the sputtering process or the evaporation process firstly passes through the hollow structure 403, then passes through the pattern region 103, and finally is attached to the substrate. The first welding region 404 and the second welding region 405 refer to regions for welding to the first welding region 101 and the second welding region 102 shown in FIG. 1.

In this mask plate frame, the first welding region 404 and the second welding region 405 are disposed on at least one side of the mask plate frame 40. When the mask plate frame is used, the metal mask strip 10 may be welded to the mask plate frame 40. During welding, the pattern region 103 of the metal mask strip 10 corresponds to the hollow structure 403 on the mask plate frame 40 and then the metal mask strip 10 is bent downwards. In this case, the metal mask strip 10 is welded to the first welding region 404 and the welding region 405 on the side surface of the mask plate frame 40. As the first welding region 404 and the second welding region 405 are disposed on the side surface of the mask plate frame 40, welding spots formed when the mask plate frame is welded to the metal mask strip 10 are lower than the top surface 401 of the mask plate frame 40. Therefore, the gap between the metal mask plate and the surface of the substrate is eliminated, the alignment accuracy is improved and thus the coating accuracy is improved. In addition, no damage may be caused to the substrate since the substrate is in no contact with the welding spots. Moreover, after the metal mask strip 10 is bent, wrinkles outside the bendable region 104 (such as the welding region) generated in a stretching and welding process may not be transferred to the pattern region 103, such that the wrinkles in the pattern region 103 of the metal mask strip 10 may be flattened, thereby improving the coating accuracy.

The mask plate frame 40 may be made of metal to ensure that the mask plate frame may be welded to the metal mask strip 10.

In the mask plate frame 40 shown in FIG. 4, two side surfaces of the hollow structure 403 each have one welding region, i.e., the first welding region 404 and the second welding region 405. In other implementations, the number of welding regions on each of two sides of the hollow structure 403 may be greater than one. The numbers of the welding regions on two sides of the hollow structure 403 may be equal or unequal.

In the mask plate frame 40 shown in FIG. 4, the side surface further includes a first inclined surface 406 disposed between the top surface 401 and the bottom surface 402, and a first included angle $\alpha_1$ between the first inclined surface 406 and the bottom surface 402 is an acute angle. Optionally, the side surfaces may include two opposite first inclined surfaces 406 and thus the first welding region 404 and the second welding region 405 may be disposed on the two first inclined surfaces 406 respectively.

In the mask plate frame 40 shown in FIG. 4, by disposing the welding region on the first inclined surface 406, the bending angle when the metal mask strip 10 is bent may be small and it is unlikely to damage the metal mask strip 10.

In other implementations, the side surface of the mask plate frame 40 may be provided with no first inclined surface 406, that is the side surface is a vertical plane. This implementation makes the structure of the mask plate frame 40 simpler.

In the embodiment of the present disclosure, the first included angle $\alpha_1$ may be in a range of 5 to 45 degrees, such that it is unlikely to damage the metal mask strip 10 during bending.

In the mask plate frame 40 shown in FIG. 4, the first inclined surface 406 is connected to the top surface 401 of the mask plate frame 40 with the connecting line being 4071, and the connecting line 4071 corresponds to the bendable region 104 of the metal mask strip 10. The metal mask strip 10 is bent downwards at the connecting line 4071 during welding.

Figure 5:
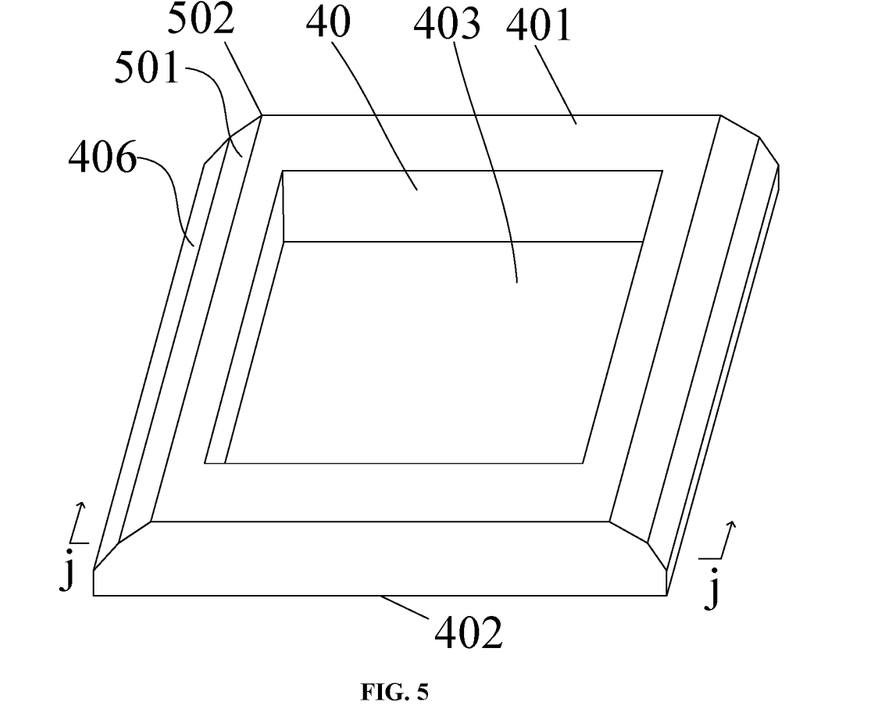
FIG. 5 is a structural diagram of another mask plate frame according to an embodiment of the present disclosure.
Figure 6:
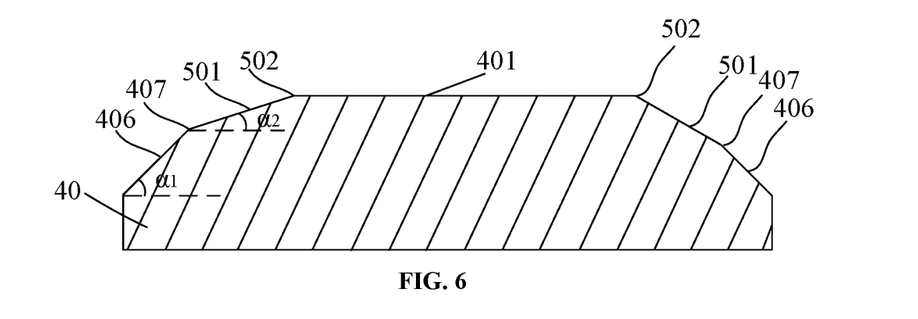
FIG. 6 is a schematic sectional view of another mask plate frame according to an embodiment of the present disclosure.

FIG. 5 is a diagram of another mask plate frame according to an embodiment of the present disclosure. The mask plate frame shown in FIG. 5 differs from the mask plate frame shown in FIG. 4 in that in the structure shown in FIG. 5, the mask plate frame 40 further includes a second inclined surface 501 disposed between the top surface 401 and the first inclined surface 406. The first inclined surface 406 is connected to the second inclined surface 501. As shown in FIG. 6 which is a sectional view of the mask plate frame shown in FIG. 5 at the position j-j, the second inclined surface 501 is connected to the top surface 401, and a first connecting line 407 and a second connecting line are parallel to each other. The first connecting line 407 is a connecting line that connects the first inclined surface 406 and the second inclined surface 501 and the second connecting line 502 is a connecting line that connects the second inclined surface 501 and the top surface 401.

By increasing the number of inclined surfaces on the metal mask plate frame 40, the flattening effect on the wrinkles of the metal mask strip 10 during welding may be enhanced. In addition, the first connecting line 407 of the first inclined surface 406 and the second inclined surface 501 and the second connecting line 502 of the second inclined surface 501 and the top surface 401 are parallel to each other, such that it is easier to control the metal mask strip 10 to bend at the first connecting line 407 and the second connecting line 502.

In other implementations, the first connecting line 407 of the first inclined surface 406 and the second inclined surface 501 and the second connecting line 502 of the second inclined surface 501 and the top surface 401 may also not parallel to each other.

In the mask plate frame 40 shown in FIG. 6, each of two sides of the hollow structure 403 of the mask plate frame 40 includes two inclined surfaces. In other embodiments, the number of inclined surface on one side of the hollow structure 403 may be one.

In other embodiments, the number of inclined surfaces on each side of the hollow structure 403 may be greater than two.

In addition, the numbers of the inclined surfaces on two sides of the hollow structure 403 may be equal or unequal.

As shown in FIG. 6, the first included angle $\alpha_1$ between the first inclined surface 406 and the bottom surface 402 is greater than a second included angle $\alpha_2$ between the second inclined surface 501 and the bottom surface 402. The lower inclined surface has a greater slope than the upper inclined surface, such that the metal mask strip 10 is also bent between the inclined surfaces and thus the flattening effect on the wrinkles of the metal mask strip 10 is enhanced.

In the embodiment of the present disclosure, a difference between the first included angle $\alpha_1$ and the second included angle $\alpha_2$ is in a range of 5 to 35 degrees, such that the metal mask strip 10 is bent more easily and has low possibility of being damaged during use.

Figure 7:
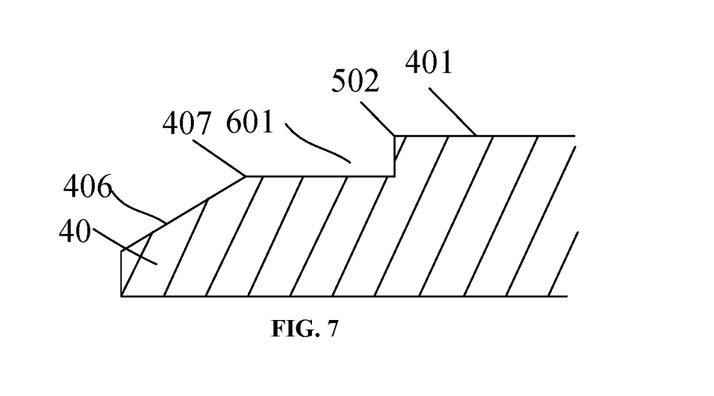
FIG. 7 is a schematic sectional view of one side of still another mask plate frame according to an embodiment of the present disclosure.

FIG. 7 is a sectional view of one side of still another mask plate frame according to an embodiment of the present disclosure (for example, it may be a sectional view of still another mask plate frame at the position j-j similar to that shown in FIG. 5). The mask plate frame shown in FIG. 7 differs from the mask plate frame shown in FIG. 6 in that in the structure shown in FIG. 7, the second inclined surface 501 is provided with a groove 601.

By disposing the second groove 601 on the second inclined surface 501, the case where the unevenness of the inclined surface portion of the mask plate frame 40 affects the bonding of the metal mask strip 10 may be prevented, and then the unevenness is transferred and affects flatness of the pattern region 103.

In other implementations, when the number of inclined surfaces on one side of the hollow structure 403 is greater than two, correspondingly, more grooves 601 may be disposed to avoid the situation that the unevenness of the inclined surface portion of the mask plate frame 40 affects the bonding of the metal mask strip 10 and then this unevenness is transferred and affects flatness of the pattern region 103. For example, if the number of inclined surfaces on one side of the hollow structure 403 is three, it is possible to dispose respectively grooves 601 on two inclined surfaces closest to the hollow structure 403 and to dispose a welding region on the inclined surface farthest from the hollow structure 403.

In the mask plate frames 40 shown in FIGS. 4-7, at least one of the first connecting line 407 and the second connecting line 502 may be defined as an arcuate bending region. That is, the mask plate frame 40 further includes an arcuate bending region.

The arcuate bending region protects the bendable region 104 of the metal mask strip 10, such that it is unlikely to damage the metal mask strip 10 during bending.

The arc radius of the arcuate bending region is determined according to different product designs and processes. The arcuate bending region has an arc radius greater than the thickness of the metal mask strip 10. This ensures that the arcuate bending region has an enough arc length, such that it is unlikely to damage the metal mask strip 10 during bending.

An embodiment of the present disclosure further provides a metal mask plate. The metal mask plate includes the metal mask strip 10 and the mask plate frame 40 described above.

The metal mask plate according to the embodiment of the present disclosure may be a fine metal mask (FMM) plate and may be configured to deposit an R/G/B light-emitting film layer in a display panel so as to ensure that the material is vapor-deposited at a prescribed position.

The following exemplarily describes the structure of the metal mask plate in conjunction with the accompanying drawings.

Figure 8:
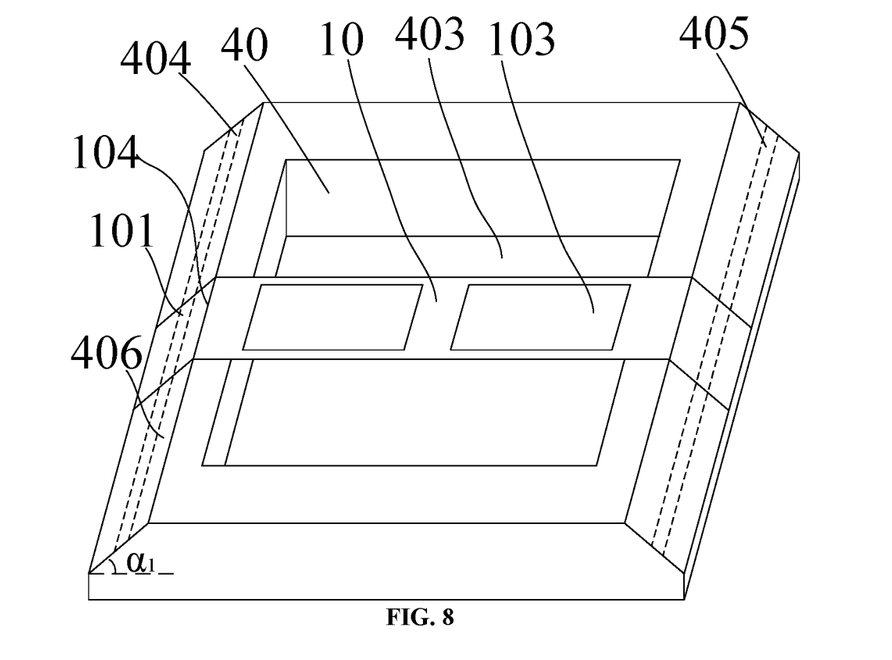
FIG. 8 is a structural diagram of a metal mask plate according to an embodiment of the present disclosure.

FIG. 8 is a structural diagram of a metal mask plate according to an embodiment of the present disclosure. With reference to FIG. 8, the metal mask plate includes the metal mask strip 10 as shown in FIG. 1 and the mask plate frame 40 as shown in FIG. 4.

When the metal mask strip 10 is used, the metal mask strip 10 needs to be welded to the mask plate frame 40. During welding, the pattern region 103 of the metal mask strip 10 corresponds to the hollow structure 403 on the mask plate frame 40, the bendable region 104 of the metal mask strip 10 overlaps the edge, close to the side surface of the mask plate frame 40 which is provided with the first welding region 404 or the second welding region 405, of the top surface 401 of the mask plate frame 40, and then the metal mask strip 10 is bent downwards in the bendable region 104. Thus the metal mask strip 10 is welded to the welding region on the side surface of the metal mask plate frame 40.

As the metal mask strip 10 may be bent in the bendable region 104, the wrinkles in the pattern region 103 may be flattened, thereby improving the coating accuracy. In addition, the first welding region 404 and the second welding region 405 are disposed on the side surface of the mask plate frame 40, such that the welding spots formed by welding are not in contact with the substrate and the damage to the substrate does not appear, thereby increasing the production yield. After the metal mask strip 10 is bent, wrinkles outside the bendable region 104 (such as the welding region) generated in a stretching and welding process may not be transferred to the pattern region 103, such that the wrinkles in the pattern region 103 of the metal mask strip 10 may be flattened, thereby improving the coating accuracy.

Figure 9:
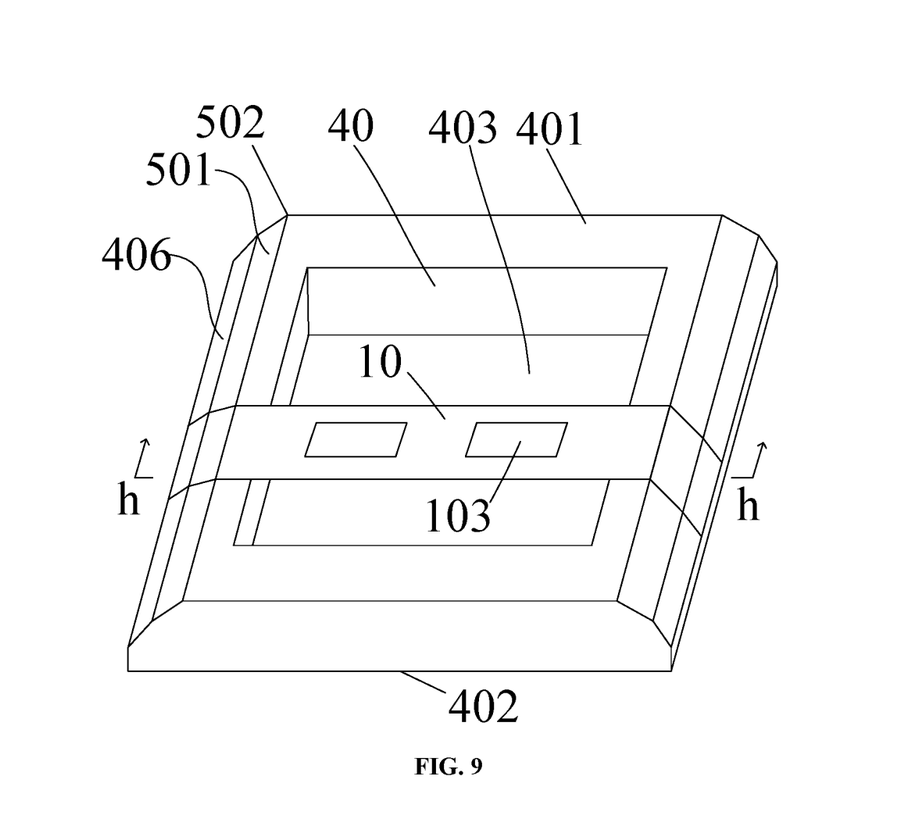
FIG. 9 is a structural diagram of another metal mask plate according to an embodiment of the present disclosure.

FIG. 9 is a structural diagram of another metal mask plate according to an embodiment of the present disclosure. As shown in FIG. 9, the metal mask plate includes the metal mask strip 10 as shown in FIG. 3 and the mask plate frame 40 as shown in FIG. 6.

Figure 10:
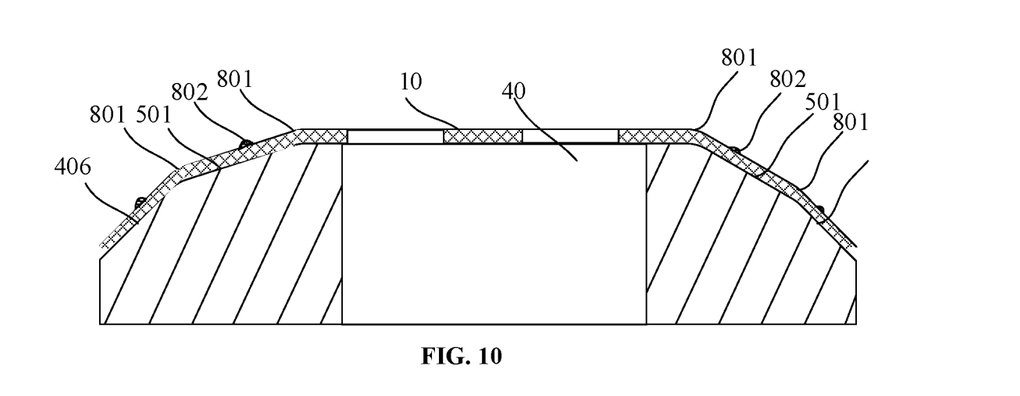
FIG. 10 is a schematic sectional view of another metal mask plate according to an embodiment of the present disclosure.

As shown in FIG. 10 which is a sectional view of the metal mask plate shown in FIG. 9 at the position h-h, for the mask plate frame 40, an intersection of the first inclined surface 406 and the top surface 401 is defined as an arcuate bending region 801, and an intersection of the first inclined surface 406 and the second inclined surface 501 is defined as an arcuate bending region 801.

In the mask plate frame shown in FIG. 10, by defining an intersection of the second inclined surface 501 and the top surface 401 and an intersection of the second inclined surface 501 and the first inclined surface 406 as the arcuate bending regions 801, the bendable region 104 of the metal mask strip 10 may be protected.

Two inclined surfaces are arranged on each of two sides of the hollow structure 403 of the mask plate frame 40 shown in FIG. 10. The two inclined surfaces on each side each are provided with a welding region. Welding spots 802 are formed after welding is completed. The welding spot 802 refers to a raised point formed after a metal material is melted and solidified in the welding process of the metal mask strip 10 and the mask plate frame 40. The welding spots 802 are lower than the top surface 401 of the mask plate frame 40.

In other implementations, it is possible to dispose the welding region on one of the inclined surfaces on each side of the hollow structure 403 of the mask plate frame 40. That is, welding is performed on one inclined surface only.

In FIG. 10, when the metal mask strip 10 is welded to the mask plate frame 40, the numbers of the welding spots 802 formed in various welding regions may be equal or unequal. There may be tens to hundreds welding spots 802 in each welding region.

Figure 11:
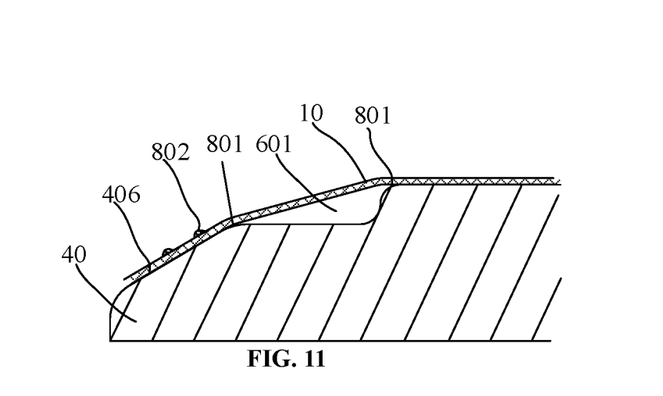
FIG. 11 is a schematic sectional view of one side of still another metal mask plate according to an embodiment of the present disclosure.

FIG. 11 is a sectional view of still another metal mask plate according to an embodiment of the present disclosure (for example, it may be a sectional view at the position h-h similar to that shown in FIG. 9). With reference to FIG. 11, the metal mask plate includes the metal mask strip 10 as shown in FIG. 2 and the mask plate frame 40 as shown in FIG. 7. The metal mask strip 10 and the mask plate frame 40 are welded on the first inclined surface 406 to form welding spots 802. The metal mask strip 10 is not in contact with the mask plate frame 40 at the groove 601. Thus, the case where the flattening effect on the wrinkles of the metal mask strip 10 is affected due to unevenness of the mask plate frame 40 at the groove 601 may be prevented.

In the mask plate frame shown in FIG. 11, by defining an intersection of the second inclined surface 501 and the top surface 401 (i.e., an intersection of the groove 601 and the top surface 401) and an intersection of the second inclined surface 501 and the first inclined surface 406 (i.e., an intersection of the groove 601 and the first inclined surface 406) as arcuate bending regions 801, the bendable region 104 of the metal mask strip 10 may be protected.

Figure 12:
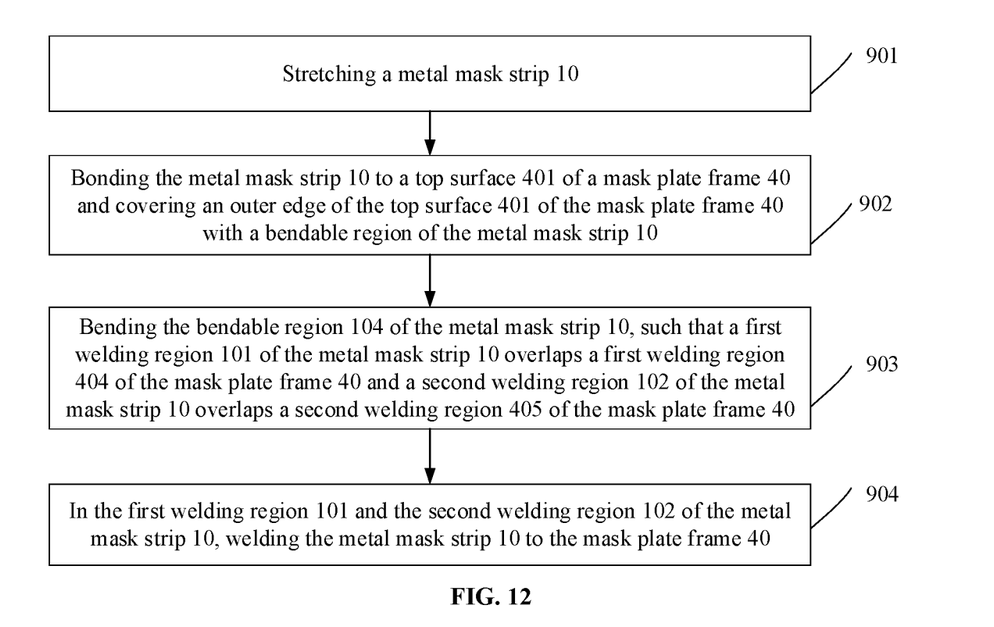
FIG. 12 is a flowchart of a welding method of a metal mask plate according to an embodiment of the present disclosure.

FIG. 12 is a flowchart of a welding method of a metal mask plate according to an embodiment of the present disclosure. With reference to FIG. 12, the method includes the following steps.

In step 901, a metal mask strip 10 is stretched.

This metal mask strip is the above metal mask strip 10 as shown in FIGS. 1-3.

The following describes the welding method of the metal mask plate in conjunction with FIGS. 13-17 by taking the metal mask strip 10 shown in FIG. 1 and the mask plate frame 40 shown in FIG. 4 as an example (the position of the section in FIGS. 13-17 may refer to the position h-h in FIG. 9).

Figure 13:
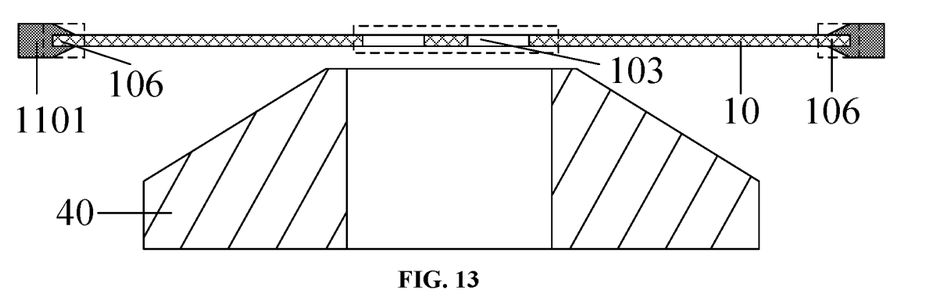
FIGS. 13-17 are diagrams showing the welding process of the metal mask strip and mask plate according to embodiments of the present disclosure.

As shown in FIG. 13, clamping regions 106 of the metal mask strip 10 are clamped by clamping manipulators 1101 capable of rotating by an angle and then the metal mask strip 10 is stretched, such that the pattern region 103 of the metal mask strip 10 corresponds to the hollow structure 403 (not shown in the figure) of the mask plate frame 40.

In step 902, the metal mask strip 10 is bonded to the top surface 401 of the mask plate frame 40, and an outer edge of the top surface 401 of the mask plate frame 40 is covered with the bendable region 104 of the metal mask strip 10.

This mask plate frame is the above mask plate frame 40 as shown in FIGS. 4-7. When the metal mask strip 10 of different structures is used, the mask plate frame 40 of the corresponding structure may be used. For example, when the metal mask strip 10 shown in FIG. 1 is used, the mask plate frame 40 shown in FIG. 4 is used; when the metal mask strip 10 shown in FIG. 2 is used, the mask plate frame 40 shown in FIG. 7 is used; and when the metal mask strip 10 shown in FIG. 3 is used, the mask plate frame 40 shown in FIG. 6 is used.

Figure 14:
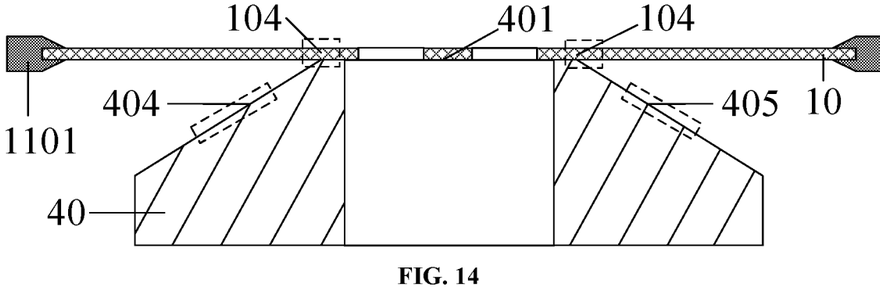

As shown in FIG. 14, the metal mask strip 10 is clamped to descend by the clamping manipulator 1101 capable of rotating by an angle, such that the metal mask strip 10 is in contact with the top surface 401 of the mask plate frame 40, and the bendable region 104 of the metal mask strip 10 overlaps an edge, close to the side surface of the mask plate frame 40 which is provided with the first welding region 404 or the second welding region 405, of the top surface 401 of the mask plate frame 40.

In step 903, the bendable region 104 of the metal mask strip 10 is bent, such that the first welding region 101 of the metal mask strip 10 overlaps the first welding region 404 of the mask plate frame 40 and the second welding region 102 of the metal mask strip 10 overlaps the second welding region 405 of the mask plate frame 40.

Figure 15:
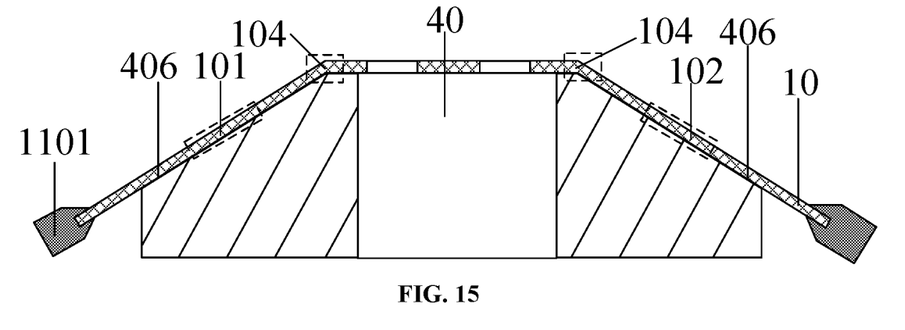

As shown in FIG. 15, the metal mask strip 10 is clamped by the clamping manipulator 1101 capable of rotating by an angle to rotate by a specific angle, such that a stretching direction of two sides of the metal mask strip 10 is consistent with the direction of the first inclined surface 406 on the mask plate frame 40. The bendable region 104 of the metal mask strip 10 is bent and two ends of the metal mask strip 10 are bonded to the first inclined surface 406 on the mask plate frame 40, such that the first welding region 101 of the metal mask strip 10 overlaps the first welding region 404 (not shown in the figure) of the mask plate frame 40 and the second welding region 102 of the metal mask strip 10 overlaps the second welding region 405 (not shown in the figure) of the mask plate frame 40.

In step 904, in the first welding region 101 and the second welding region 102 of the metal mask strip 10, the mask strip 10 is welded to the mask plate frame 40.

Figure 16:
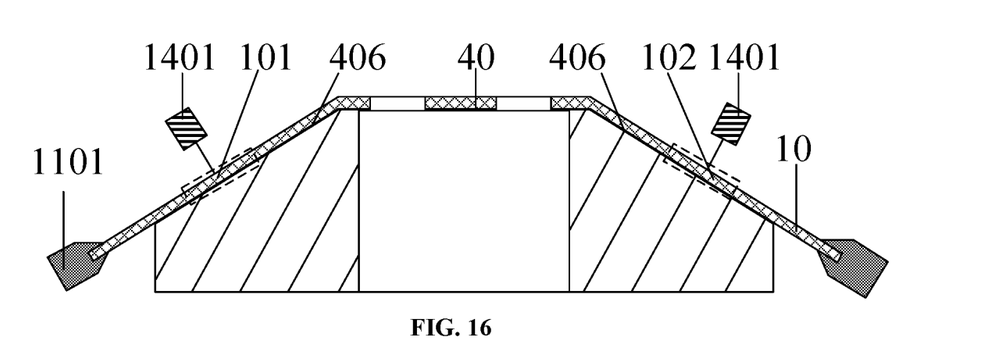

As shown in FIG. 16, a variable-angle laser welding head 1401 is moved to the first inclined surface 406 of the mask plate frame 40, such that the laser welding head 1401 and the first inclined surface 406 are perpendicular to each other, and then in the first welding region 101 and the second welding region 102 of the metal mask strip 10, the mask strip 10 is welded to the mask plate frame 40.

In FIG. 16, the laser welding head 1401 ablates the surface of the mask plate frame 40 using high-energy pulse laser with a specific wavelength to melt the welding region instantaneously, and after solidification the mask plate frame 40 may be welded to the metal mask strip 10.

When a plurality of welding regions are disposed on the same side of the mask plate frame 40, the welding sequence of the plurality of welding regions may not be limited.

Figure 17:
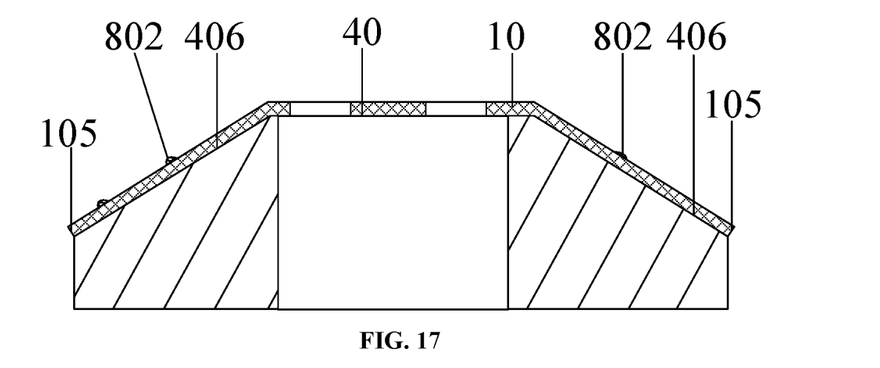

As shown in FIG. 17, after laser welding, welding spot 802s are formed on the first inclined surface 406, and the metal mask strip 10 is cut at the cutting line 105 of the metal mask strip 10 to remove the clamping region 106 (not shown in the figure). Thus, the welding of the metal mask plate is completed.

Figure 18:
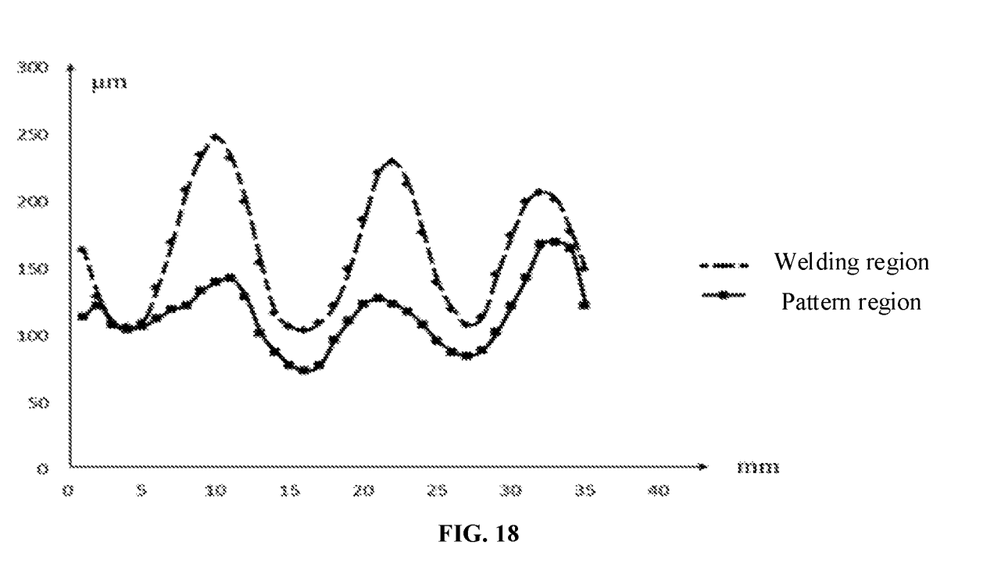
FIG. 18 is a comparison diagram of wrinkles in a pattern region and a welding region of a metal mask strip.
Figure 19:
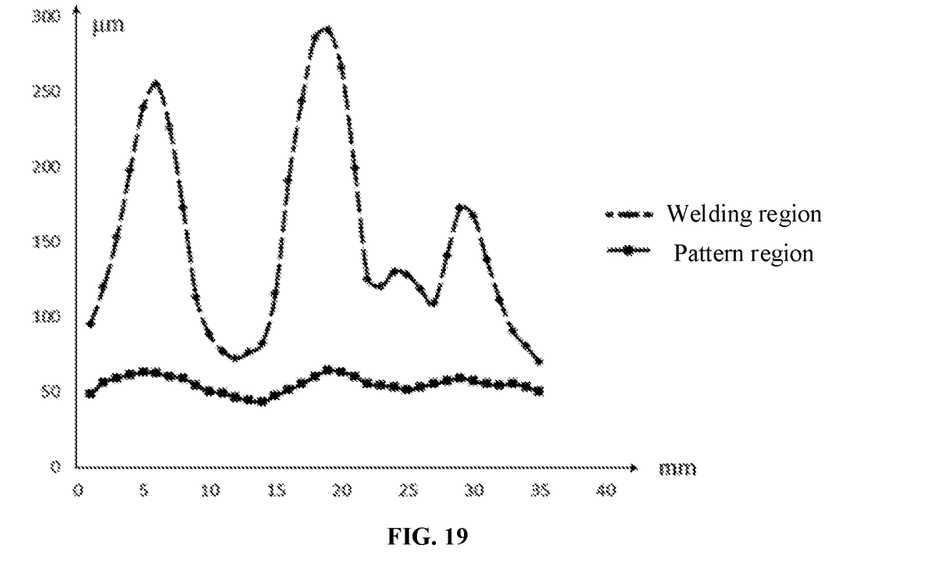
FIG. 19 is a comparison diagram of wrinkles in a pattern region and a welding region of a metal mask strip according to an embodiment of the present disclosure.

The following describes the effects of the solutions according to the embodiments of the present disclosure in conjunction with the accompanying drawings. FIG. 18 is a comparison diagram of wrinkles in a pattern region 103 and a welding region of a metal mask strip 10. FIG. 19 is a comparison diagram of wrinkles in a pattern region 103 and a welding region of a metal mask strip 10 according to an embodiment of the present disclosure. The abscissa indicates the position of the welding region or the pattern region 103 in mm. For example, the coordinate 0 not only indicates the position 0 of the pattern region 103, but also indicates the position 0 of the welding region, and the positions 0 of the two regions may refer to different positions. The ordinate indicates the height of a wrinkle in μm.

It can be obviously seen from the comparison between FIG. 18 and FIG. 19 that the technical solutions of the present disclosure may significantly overcome the wrinkling of the pattern region 103 on the metal mask strip 10 and thus improves the coating accuracy.

Described above are merely exemplary embodiments of the present disclosure, and are not intended to limit the present disclosure. Any modifications, equivalent replacements, improvements and the like made within the spirit and principles of the present disclosure should be included within the protection scope of the present disclosure.

What is claimed is:

1. A mask plate, comprising a mask plate frame and a mask strip; wherein
the mask plate frame comprises a top surface and a bottom surface which are opposite to each other, a side surface connected to the top surface and the bottom surface, and a hollow structure running through the top surface and the bottom surface;
the side surface of the mask plate frame comprises two welding regions which are disposed on two opposite sides of the hollow structure respectively;
the mask strip comprises a first welding region, a second welding region, and a pattern region between the first welding region and the second welding region, wherein the pattern region of the mask strip corresponds to the hollow structure of the mask plate frame, and the first welding region and the second welding region of the mask strip are respectively welded to the two welding regions of the mask plate frame; and
the mask strip further comprises a bendable region, the bendable region being disposed both between the first welding region and the pattern region, and between the second welding region and the pattern region, wherein the bendable region is provided with a mark line that distinguishes the bendable region from a region of the mask strip except the bendable region, such that the bendable region overlaps an edge of the side surface of the mask plate frame during welding; and
the mask strip further comprises two cutting lines along which the mask strip is cut after the welding is completed to remove unnecessary parts on the mask strip.

2. The mask plate according to claim 1, wherein at least one of a region between the first welding region and the pattern region and a region between the second welding region and the pattern region is provided with two bendable regions.

3. The mask plate according to claim 2, wherein the two bendable regions are sequentially disposed along a lengthwise direction of the mask strip.

4. The mask plate according to claim 1, wherein the mask strip further comprises a third welding region disposed:
between the bendable region and the first welding region; and/or
between the bendable region and the second welding region.

5. The mask plate according to claim 1, wherein the mask strip is a metal mask strip.

6. The mask plate according to claim 1, wherein at least one of a region between the first welding region and the pattern region and a region between the second welding region and the pattern region is provided with two bendable regions, and the two bendable regions are sequentially disposed along a lengthwise direction of the mask strip; and
the mask strip further comprises a third welding region disposed:
between the bendable region and the first welding region; and/or
between the bendable region and the second welding region.

7. The mask plate according to claim 1, wherein the first included angle defined between the first inclined surface and the bottom surface is an acute angle.

8. The mask plate according to claim 7, wherein the first included angle is in a range of 5 to 45 degrees.

9. The mask plate according to claim 7, wherein a first connecting line and a second connecting line are arranged parallel to each other, the first connecting line being a connecting line that connects the first inclined surface and the second inclined surface, and the second connecting line being a connecting line that connects the second inclined surface and the top surface.

10. The mask plate according to claim 9, wherein a difference between the first included angle and the second included angle is in a range of 5 to 35 degrees.

11. The mask plate according to claim 9, wherein the second inclined surface is provided with a groove.

12. The mask plate according to claim 1, wherein the side surface comprises a first inclined surface, and a second inclined surface disposed between the top surface and the first inclined surface, wherein the first inclined surface is directly connected to the second inclined surface, the second inclined surface is directly connected to the top surface, and at least one of the two welding regions is disposed on the first inclined surface, a first included angle defined between the first inclined surface and the bottom surface being greater than a second included angle defined between the second inclined surface and the bottom surface.

13. The mask plate according to claim 12, wherein the mask plate frame further comprises an arcuate bending region, wherein the arcuate bending region is disposed at least one of: an intersection of the first inclined surface and the second inclined surface, or an intersection of the second inclined surface and the top surface.

14. The mask plate according to claim 12, wherein a first included angle defined between the first inclined surface and the bottom surface is an acute angle;

the first included angle is in a range of 5 to 45 degrees; and a first connecting line and a second connecting line are arranged parallel to each other, the first connecting line being a connecting line that connects the first inclined surface and the second inclined surface, and the second connecting line being a connecting line that connects the second inclined surface and the top surface.

15. The mask plate according to claim 1, wherein the mask strip further comprises two clamping regions in which the mask strip is clamped during the welding.

\* \* \* \* \*